United States Patent
Enami et al.

(10) Patent No.: US 8,508,396 B2
(45) Date of Patent: Aug. 13, 2013

(54) SIGNAL PROCESSING DEVICE, SIGNAL PROCESSING METHOD, RECEPTION DEVICE, TRANSMISSION/RECEPTION DEVICE, COMMUNICATION MODULE, AND ELECTRONIC DEVICE

(75) Inventors: Akira Enami, Ashiya (JP); Keisuke Uno, Ikoma (JP); Hayami Hosokawa, Kyoto (JP); Kentaro Hamana, Kusatsu (JP); Tetsuya Nosaka, Ibaraki (JP)

(73) Assignee: OMRON Corporation, Kyoto (JP)

( * ) Notice: Subject to any disclaimer, the term of this patent is extended or adjusted under 35 U.S.C. 154(b) by 110 days.

(21) Appl. No.: 13/003,778

(22) PCT Filed: Feb. 20, 2009

(86) PCT No.: PCT/JP2009/053059
§ 371 (c)(1),
(2), (4) Date: Mar. 31, 2011

(87) PCT Pub. No.: WO2010/010722
PCT Pub. Date: Jan. 28, 2010

(65) Prior Publication Data
US 2011/0176586 A1    Jul. 21, 2011

(30) Foreign Application Priority Data

Jul. 23, 2008   (JP) .................................. 2008-189902

(51) Int. Cl.
*H03M 1/00* (2006.01)
(52) U.S. Cl.
USPC .......................................... 341/139; 341/155
(58) Field of Classification Search
USPC ................. 341/139, 155, 156, 122, 123, 169
See application file for complete search history.

(56) References Cited

U.S. PATENT DOCUMENTS

| | | | | |
|---|---|---|---|---|
| 6,078,462 | A | * | 6/2000 | Zuffada et al. ............. 360/77.08 |
| 6,104,559 | A | * | 8/2000 | Sakai ............................... 360/51 |
| 6,157,688 | A | * | 12/2000 | Tamura et al. ................. 375/348 |

FOREIGN PATENT DOCUMENTS

| | | |
|---|---|---|
| JP | 6-077874 A | 3/1994 |
| JP | 2003-046401 A | 2/2003 |
| JP | 2003-229841 A | 8/2003 |
| JP | 2004-135188 A | 4/2004 |
| JP | 2005-005973 A | 1/2005 |
| JP | 2006-081141 A | 3/2006 |

OTHER PUBLICATIONS

International Search Report issued in PCT/JP2009/053059, mailed on Jun. 2, 2009, with translation, 4 pages.

* cited by examiner

*Primary Examiner* — Joseph Lauture
(74) *Attorney, Agent, or Firm* — Osha Liang LLP

(57) ABSTRACT

It is possible to reduce a noise component mixed in an analog signal while suppressing increase of power consumption. An amplification unit amplifies the inputted analog signal and converts the amplified signal into a digital signal of a predetermined format for output. The amplification unit includes: an analog circuit unit for processing an analog signal; and a digital circuit unit for processing a digital signal; wherein the circuits are arranged on a substrate. The analog circuit unit includes: an amplification circuit for amplifying the inputted analog signal; and an LPF for cutting off a high frequency component of the amplified analog signal. The digital circuit unit includes: a rectification circuit which rectifies a waveform of the signal whose high-frequency component is cut off; and digital output circuit which converts the waveform-rectified signal into a digital signal of a predetermined format for output.

17 Claims, 12 Drawing Sheets

SIGNAL PROCESSING DEVICE, SIGNAL PROCESSING METHOD, RECEPTION DEVICE, TRANSMISSION/RECEPTION DEVICE, COMMUNICATION MODULE, AND ELECTRONIC DEVICE

BACKGROUND OF THE INVENTION

1. Technical Field

One or more embodiments of the present invention relate to a signal processing device and a signal processing method for amplifying an inputted analog signal, converting the amplified signal to a digital signal for output, as well as a reception device, a transmission/reception device, a communication module and an electronic device including the signal processing device. Specifically, one or more embodiments of the present invention relate to a signal processing device for processing signals received from a light waveguide through a light receiving element.

2. Background Art

In recent years, an optical transmission technique using an optical transmission path (light waveguide) such as an optical fiber is used for a data communication technique that enables large capacity data communication at high speed. In an optical transmission system using such an optical transmission technique, when a digital electric signal (hereinafter simply referred to as "digital signal") is inputted, a transmission side device drives a light emitting element such as semiconductor laser based on the inputted digital signal, generates an optical signal, and transmits the generated optical signal to an optical transmission path. The optical signal from the transmission side device is propagated through the optical transmission path and reaches the reception side device. The reception side device converts the optical signal from the optical transmission path to an analog electric signal (hereinafter simply referred to as "analog signal") with a light receiving element such as a PD (Photo-Diode), appropriately amplifies the signal with an amplification unit, and then converts the amplified signal to a digital signal for output.

Therefore, an analog circuit for processing the analog signal and a digital circuit for processing the digital signal exist in the reception side device. Recently, forming the single processing circuits on one chip is demanded from the standpoint of miniaturization of the device, and the analog circuit and the digital circuit are demanded to be formed into one chip.

On the other hand, lowering of the drive voltage of the digital circuit is advancing with miniaturization of the digital circuit, and lower voltage of the digital signal, that is, lowering of the common mode voltage of the digital signal is advancing. For instance, in the standard of digital interface, the LVDS (Low Voltage Differential Signaling) (amplitude of about 400 mV, common mode voltage of about 0.9 to 1.2 V) is transitioning to SLVS (Scalable Low Voltage Signaling) (amplitude of about 200 V, common mode voltage of about 0.2 V) of smaller amplitude and lower voltage drive.

The usage band of the digital signal is rising and higher speed of the digital signal is advancing due to the lowering of the drive voltage of the digital circuit. However, the harmonic noise also increases with rise in the usage band. Furthermore, the switching noise in the digital circuit also increases with higher speed of the digital signal. Such a switching noise is a steep pulse-shaped noise and has a wide band spectrum.

As described above, if the analog circuit and the digital circuit are formed into one chip, the noise generated in the digital circuit may propagate and adversely affect the analog circuit. Thus, noise countermeasures such as avoiding the noise from going around (propagating) from the digital circuit to the analog circuit or reducing the noise component mixed to the analog signal need to be taken.

Patent Document 1: Japanese Unexamined Patent Publication No. 2004-135188 (date of publication Apr. 30, 2004)

Patent Document 2: Japanese Unexamined Patent Publication No. 2006-081141 (date of publication Mar. 23, 2006)

SUMMARY OF INVENTION

The noise countermeasures for avoiding the propagation of noise from the digital circuit to the analog circuit include the following. In other words, consideration is made to clearly separate the portion of analog circuit and the portion of digital circuit on the chip. In this case, however, the layout of the chip is limited, and the designing of the circuit becomes difficult.

Consideration is also made to separate the power supply line for the analog circuit and the digital circuit on the chip and on the package, or to separate the ground line for the analog circuit and for the digital circuit. However, the capacitive component and inductance component remain between the separated power supply lines, and similarly, the capacitive component and inductance component remain between the separated ground lines, and hence it is difficult to completely suppress the propagation of noise.

Consideration is also made to reduce the inductance component of the wiring. This includes thickening (strengthening) the ground line, shortening the length of the wiring, reducing the bend of the wiring, and the like. In this case, however, the layout of the chip is limited, and the designing of the circuit becomes difficult.

As described above, because it is difficult to completely avoid the propagation of noise from the digital circuit to the analog circuit, noise countermeasures for reducing the noise component mixed in the analog signal become necessary. The noise countermeasures include the following.

Specifically, in the light transmission circuit described in Patent Document 1, the current outputted from the PD is converted into voltage in a TIA (Trans-Impedance Amplifier) and inputted to one input terminal of a differential amplifier through a coupling capacitor. On the other hand, the current flowing through a dummy capacitance formed same as a parasitic capacitance of the PD is converted into voltage in an amplifier similar to the TIA and inputted to the other input terminal of the differential amplifier through the coupling capacitor. The noise propagated from the ground line through the PD and the TIA and the noise propagated from the ground line through the dummy capacitance and the amplifier are thus inputted to the respective input terminals of the differential amplifier at the same phase, and hence the noise can be removed.

Because the noise generated in the digital circuit influences each element of the analog circuit through the power supply line, the ground line, the inductive coupling, the electrostatic coupling, and the like, the noise countermeasures also need to be performed in the elements on the downstream side of the TIA. However, if the dummy capacitance and the amplifier are arranged for every element, the scale of the device enlarges and the power consumption increases.

A configuration of arranging a filter in the main path for transmitting the analog signal from the PD is also considered. For instance, in the light receiver described in Patent Document 2, the analog signal from the TIA is filtered in a varying pass band with a filter and amplified by an amplification circuit on the downstream side.

When a filter is used, the waveform of the filtered signal inevitably degrades. Thus, a waveform shaping circuit for shaping the degraded waveform needs to be arranged at the post-stage of the filter or the waveform shaping needs to be carried out in the amplifier circuit arranged at the post-stage of the filter. However, the current corresponding to the necessary band needs to be continuously flowed to shape the waveform, which increases power consumption.

One or more embodiments of the present invention provide a signal processing device capable of reducing the noise component mixed in the analog signal while suppressing the increase in the power consumption.

According to one or more embodiments of the present invention, there is provided a signal processing device for amplifying an inputted analog signal, and converting the amplified signal to a digital signal for output; wherein an analog circuit unit for processing the analog signal and a digital circuit unit for processing the digital signal are arranged on a substrate; the analog circuit unit performs amplification and cuts off a high frequency component with respect to the inputted analog signal; and the digital circuit unit performs conversion to a digital signal of a predetermined format and waveform rectification with respect to the signal which is subjected to amplification and whose high frequency component is cut off by the analog circuit unit for output.

According to one or more embodiments of the present invention, there is provided a signal processing method of a signal processing device for amplifying an inputted analog signal, and converting the amplified signal to a digital signal for output, the signal processing device having an analog circuit unit for processing the analog signal and a digital circuit unit for processing the digital signal arranged on a substrate, the method including the steps of: performing amplification and cutting off a high frequency component with respect to the inputted analog signal in the analog circuit unit; and performing conversion to a digital signal of a predetermined format and waveform rectification with respect to a signal which is subjected to amplification and whose high frequency component is cut off in the digital circuit unit for output.

According to the configuration and the method described above, the inputted analog signal is subjected to amplification and the high-frequency component is cut off in the analog circuit unit. The high-frequency noise mixed to the analog signal propagated from the digital circuit unit to the analog circuit unit thus can be reduced.

In the digital circuit unit, the conversion to a digital signal of a predetermined format and the waveform rectification are performed on the signal which is subjected to amplification and whose high-frequency component is cut off, for output. When rectifying the waveform in the digital circuit unit, the current only flows at the time of switching. On the other hand, when rectifying the waveform in the analog circuit unit, the current needs to be continuously flowed to ensure the band. Therefore, an increase in power consumption can be suppressed by rectifying the waveform in the digital circuit unit.

In one configuration example, the analog circuit unit includes an amplification circuit for amplifying the inputted analog signal, and a low pass filter for cutting off the high frequency component of the analog signal amplified by the amplification circuit.

In another configuration example, the analog circuit unit includes an amplification circuit for amplifying the inputted analog signal, the amplification circuit having a gain adjusted to cut off the high frequency component. In such a configuration, the increase in the circuit scale can be suppressed because a low pass filter does not need to be newly arranged.

Preferably, the gain is adjusted with a current value for driving the amplification circuit. In this case, the adjustment of the gain in the amplification circuit is facilitated, and the adjustment of the high-frequency component to cut off is also facilitated.

Moreover, the current value may be smaller than or equal to 1 mA. In this case, the power of the amplification circuit can be saved because the amplification circuit is driven at low current. The lower limit value of the current value may be the minimum value of the current value at which the amplification circuit can operate.

Moreover, the current value may be a value for adjusting the gain so that a cutoff frequency for cutting off the high frequency component is between a basic frequency of a transmission frequency of the inputted analog signal and a second-order harmonic frequency. In this case, the high-frequency noise of the frequency higher than the transmission frequency of the inputted analog signal can be reduced in the amplification circuit, and hence the output waveform from the amplification circuit may become the waveform close to the fundamental wave of the inputted analog signal.

Further, the analog circuit unit preferably includes the amplification circuit in a plurality of stages. In this case, the gain of each stage becomes small and the high-frequency component can be cut off at each stage compared to the case of one stage, and hence the oscillation of the signal by the high-frequency noise from the digital circuit unit becomes difficult.

Preferably, the analog circuit unit differentially outputs a signal which is subjected to amplification and whose high frequency component is cut off. In this case, the noise of common mode can be reduced.

On the other hand, the digital circuit unit may include a waveform rectification circuit for rectifying a waveform of the signal which is subjected to amplification and whose high frequency component is cut off by the analog circuit unit, and a conversion circuit for converting the signal which waveform is rectified by the waveform rectification circuit to the digital signal for output. The waveform rectification circuit is preferably an inverter. The inverter has lower power consumption than the comparator, and thus the power consumption in the waveform rectification circuit can be further reduced. The waveform rectification circuit preferably includes inverters of different threshold values in a plurality of stages to further improve the noise characteristics.

Moreover, the digital circuit unit may include a conversion circuit for rectifying the waveform for output by converting the signal which is subjected to amplification and whose high frequency component is cut off by the analog circuit unit to the digital signal. In this case, the increase in the circuit scale can be suppressed because the waveform rectification circuit does not need to be newly arranged.

In recent years, the common mode voltage of the analog circuit unit is higher than the common mode voltage of the digital circuit unit due to miniaturization of the digital circuit. Thus, when the signal generated by the analog circuit unit is transmitted to the digital circuit unit, problems such as malfunction of the circuit may occur.

In the signal processing device according to one or more embodiments of the present invention, preferably, the analog circuit unit and the digital circuit unit are capacitively coupled. In this case, the DC component of the signal transmitted from the analog circuit unit to the digital circuit unit is removed, and thus the common mode voltage becomes the ground level and the occurrence of such a problem can be prevented.

Effects similar to the above can be obtained with the reception device including a receiving unit for receiving a signal from outside and a reception processing unit for processing the signal received by the receiving unit, where the reception processing unit is the signal processing device having the configuration described above.

Effects similar to the above can be obtained with the transmission/reception device including a transmission device for transmitting a signal to outside and a reception device of the above configuration for receiving and processing the signal from the outside.

Effects similar to the above can be obtained with a communication module including the reception device of the above configuration, and a digital device for performing processes on the digital signal outputted by the reception device.

Effects similar to the above can be obtained with a communication module including the reception device of the above configuration, a transmission device for transmitting an analog signal; and a transmission medium for transmitting the analog signal from the transmission device to the reception device.

Effects similar to the above can be obtained with an electronic device including the communication module of the above configuration.

Therefore, the signal processing device according to one or more embodiments of the present invention performs amplification and cuts off the high-frequency component with respect to the inputted analog signal in the analog circuit unit thereby obtaining the effect of reducing the high-frequency noise mixed to the analog signal propagated from the digital circuit unit to the analog circuit unit, and performs conversion to a digital signal of a predetermined format and waveform rectification on the signal which is subjected to amplification and whose high-frequency component is cut off in the digital circuit unit thereby obtaining the effect in that the increase in power consumption can be suppressed compared to the case where the waveform is rectified in the analog circuit unit.

DETAILED DESCRIPTION

First Embodiment

Figure 1:
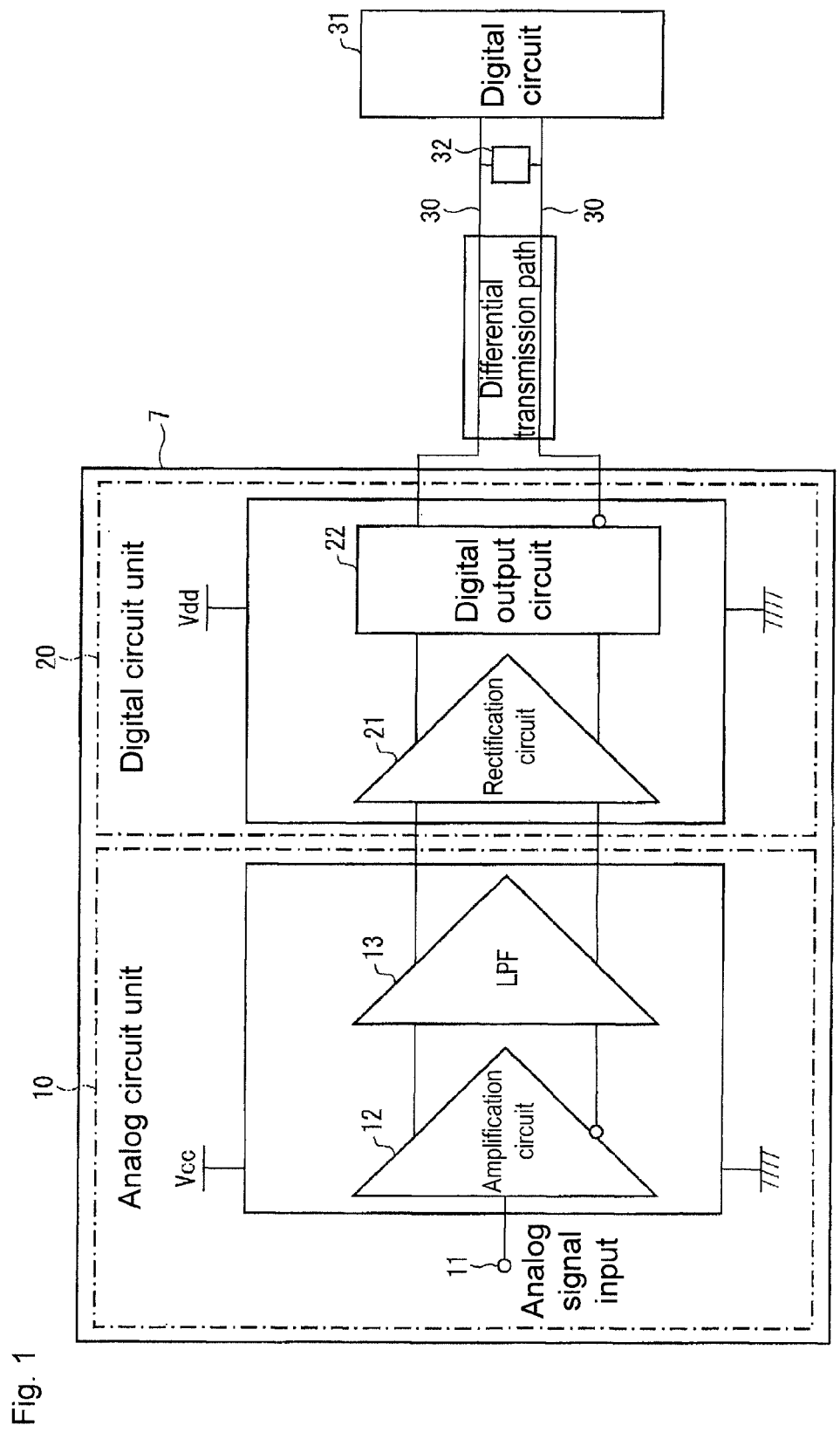
FIG. 1 is a circuit diagram showing a schematic configuration of an amplification unit of a light reception processing section in an optical transmission module according to one embodiment of the present invention.

One embodiment of the present invention will be described with reference to FIG. 1 to FIG. 3. FIG. 2 shows a schematic configuration of an optical transmission module (communication module) according to the present embodiment. As shown in the figure, the optical transmission module 1 includes a light transmission processing section (transmission device) 2, a light reception processing section (reception device) 3, and an optical waveguide 4 serving as an optical transmission path.

The light transmission processing section 2 is configured to include a light emission drive unit 5 and a light emitting unit 6. The light emission drive unit 5 drives the light emission of the light emitting unit 6 based on an externally inputted digital signal. The light emission drive unit 5 is configured by a light emission drive IC (Integrated Circuit), and the like.

The light emitting unit 6 emits light based on drive control by the light emission drive unit 5. The light emitting unit 6 is configured by a light emitting element such as VCSEL (Vertical Cavity-Surface Emitting Laser), and the like. The end on the light incident side of the optical waveguide 4 is irradiated with light emitted from the light emitting unit 6 as an optical signal.

The optical waveguide 4 is a medium for transmitting the light from the light emitting unit 6 to a light receiving unit 8. In other words, the light that entered from the light emitting unit 6 to the end on the light incident side of the optical waveguide 4 is propagated through the optical waveguide 4, and exits from the end on the light exit side of the optical waveguide 4 to the light reception processing section 3. The details on the optical waveguide 4 will be hereinafter described.

The light reception processing section 3 is configured to include an amplifier unit (signal processing device) 7 and the light receiving unit (receiving unit) 8. The light receiving unit 8 receives the light serving as the optical signal exited from the end on the light exit side of the optical waveguide 4, and outputs an analog signal through photoelectric conversion. The light receiving unit 8 is configured by a light receiving element such as a PD (Photo-Diode).

The amplifier 7 performs amplification and digital conversion on the analog signal outputted from the light receiving unit 8, and outputs the signal to the outside. The amplification unit 7 is configured by an analog/digital mounted IC (Integrated Circuit) in which an analog circuit and a digital circuit are integrated on one chip.

Figure 3:
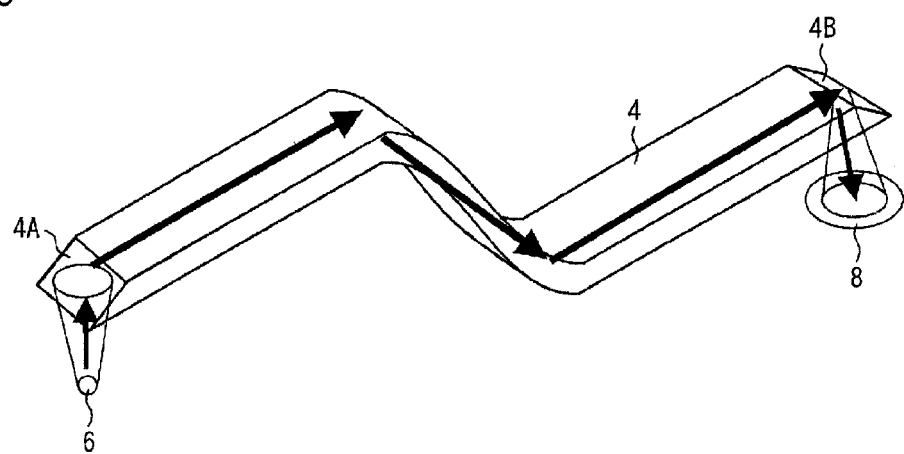
FIG. 3 is a perspective view schematically showing a state of optical transmission in the optical waveguide of the optical transmission module.

FIG. 3 is a view schematically showing the state of optical transmission in the optical waveguide 4. As shown in the figure, the optical waveguide 4 is configured by a film-like member having flexibility. A light incident surface 4A is provided at the light incident side end of the optical waveguide 4, and a light exit surface 4B is provided at the light exit side end.

The light emitted from the light emitting unit 6 enters the light incident side end of the optical waveguide 4 from a direction perpendicular to the light transmitting direction of the optical waveguide 4. The incident light advances through the optical waveguide 4 by being reflected at the light incident surface 4A. The light advanced through the optical waveguide 4 and reached the light exit side end is reflected at the light exit surface 4B so as to exit in direction perpendicular to the light transmitting direction of the optical waveguide 4. The light receiving unit 8 is irradiated with the exit light, and photoelectric conversion is carried out in the light receiving unit 8.

According to such a configuration, the light emitting unit 6 serving as a light source can be arranged in the lateral direction with respect to the light transmitting direction in the optical waveguide 4. Thus, when the optical waveguide 4 needs to be arranged parallel to the substrate surface, the light emitting unit 6 may be installed between the optical waveguide 4 and the substrate surface so as to emit the light in the normal direction of the substrate surface. Such a configuration is easier to mount than the configuration in which the light emitting unit 6 is installed so as to emit the light parallel to the substrate surface, and can be more miniaturized in terms of configuration. This is because the size in the direction perpendicular to the direction of emitting light is greater than the size in the direction of emitting light in the general configuration of the light emitting unit 6. Furthermore, application can be made even to the configuration that uses a light emitting element for plane mounting in which an electrode and the light emitting unit are in the same plane.

The details of the amplification unit 7 will now be described with reference to FIG. 1. FIG. 1 shows a circuit diagram of a schematic configuration of the amplification unit 7. As shown in the figure, the amplification unit 7 includes an analog circuit unit 10 and a digital circuit unit 20 on one chip. The analog circuit unit 10 is a section manufactured in the manufacturing process of the analog circuit, and the digital circuit unit 20 is a section manufactured in the manufacturing process of the digital circuit.

The analog circuit unit 10 includes an analog signal input terminal 11, an amplification circuit 12, and a low pass filter (LPF) 13. A power supply voltage Vcc for the analog circuit unit 10 is supplied to the amplification circuit 12 and the LPF 13. The digital circuit unit 20 includes a rectification circuit (waveform rectification circuit) 21 and a digital output circuit (conversion circuit) 22. A power supply voltage Vdd for the digital circuit unit 20 is supplied to the rectification circuit 21 and the digital output circuit 22.

The analog signal input terminal 11 is a terminal that receives the analog signal outputted from the light receiving unit 8. The analog signal inputted to the analog signal input terminal 11 is outputted to the amplification circuit 12.

The amplification circuit 12 amplifies the inputted analog signal at a predetermined gain. The amplification circuit 13 outputs the amplified signal to the LPF 13 as a differential voltage signal. A noise of a common mode can be reduced by outputting the differential voltage signal. One amplified signal may be outputted to the LPF 13 instead of the differential voltage signal.

The amplification circuit 12 may have one or a plurality of amplification stages. The first stage may be a transimpedance amplifier for amplifying a current signal generated by the light receiving unit 8 at a predetermined gain and converting the amplified signal to a voltage signal.

The LPF 13 passes the low frequency component and suppresses the high-frequency component of the differential voltage signal from the amplification circuit 12. The high-frequency noise propagated from the digital circuit unit 20 can be reduced by arranging the LPF 13. However, the waveform of the signal that passed the filter distorts. The differential voltage signal passed through the LPF 13 is thus outputted to the rectification circuit 21 of the digital circuit unit 20.

The rectification circuit 21 rectifies the waveform of the differential voltage signal from the LPF 13 to the waveform (square wave pulse) of the digital signal, and is configured by an inverter, a comparator, and the like. The differential digital signal, which the waveform is rectified, is outputted to the digital output circuit 22.

In the present embodiment, the rectification circuit 21 is arranged in the digital circuit unit 20. In the digital circuit, lower current can be achieved because current flows only at the time of switching of the signal compared to the analog circuit in which the current needs to be continuously flowed in order to ensure the band. Furthermore, in the digital circuit, the drive current and the drive voltage of the element can be suppressed low because the common mode voltage of the signal is low compared to the analog circuit. Therefore, the waveform can be rectified at low power consumption by arranging the rectification circuit 21 in the digital circuit unit 20.

Figure 2:
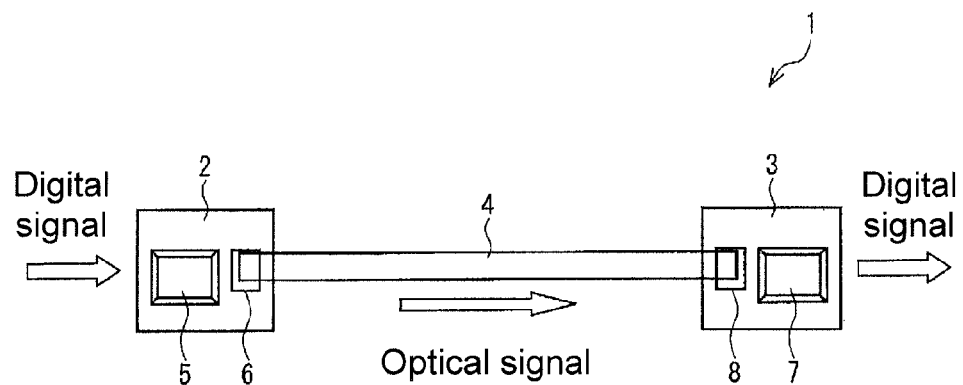
FIG. 2 is a plan view schematically showing a schematic configuration of the optical transmission module.

The rectification circuit 21 is desirably arranged at the connecting portion with the analog circuit unit 10, as shown in FIG. 1, to prevent the digital circuit from malfunctioning by the distorted signal.

The digital output circuit 22 is an interface that converts the differential digital signal from the rectification circuit 21 so as to adapt to a predetermined standard and outputs the same to the outside, and is configured by a push-pull amplifier, and the like.

The differential digital signal outputted from the digital output circuit 22 is outputted to an external digital circuit 31 through differential transmission paths 30, 30. A termination resistor 32 for impedance matching is connected between the differential transmission paths 30, 30.

Therefore, the amplification unit 7 of the present embodiment reduces the noise propagated from the digital circuit unit 20 by the inductance components of the power supply line and the ground line by means of the LPF 13 arranged on a main line (main path) for transmitting the signals, and hence does not need to arrange a countermeasure filter for reducing the noise in the power supply line and the ground line. Therefore, a circuit scale is prevented from increasing to reduce the noise from the digital circuit unit 20.

In the present embodiment, the rectification circuit 21 and the digital output circuit 22 are separately configured, but may be collected to one configuration such as a digital output circuit 22 having the waveform rectifying function. In this case, the increase of the circuit scale can be suppressed because the rectification circuit 21 does not need to be newly arranged.

Second Embodiment

Figure 4:
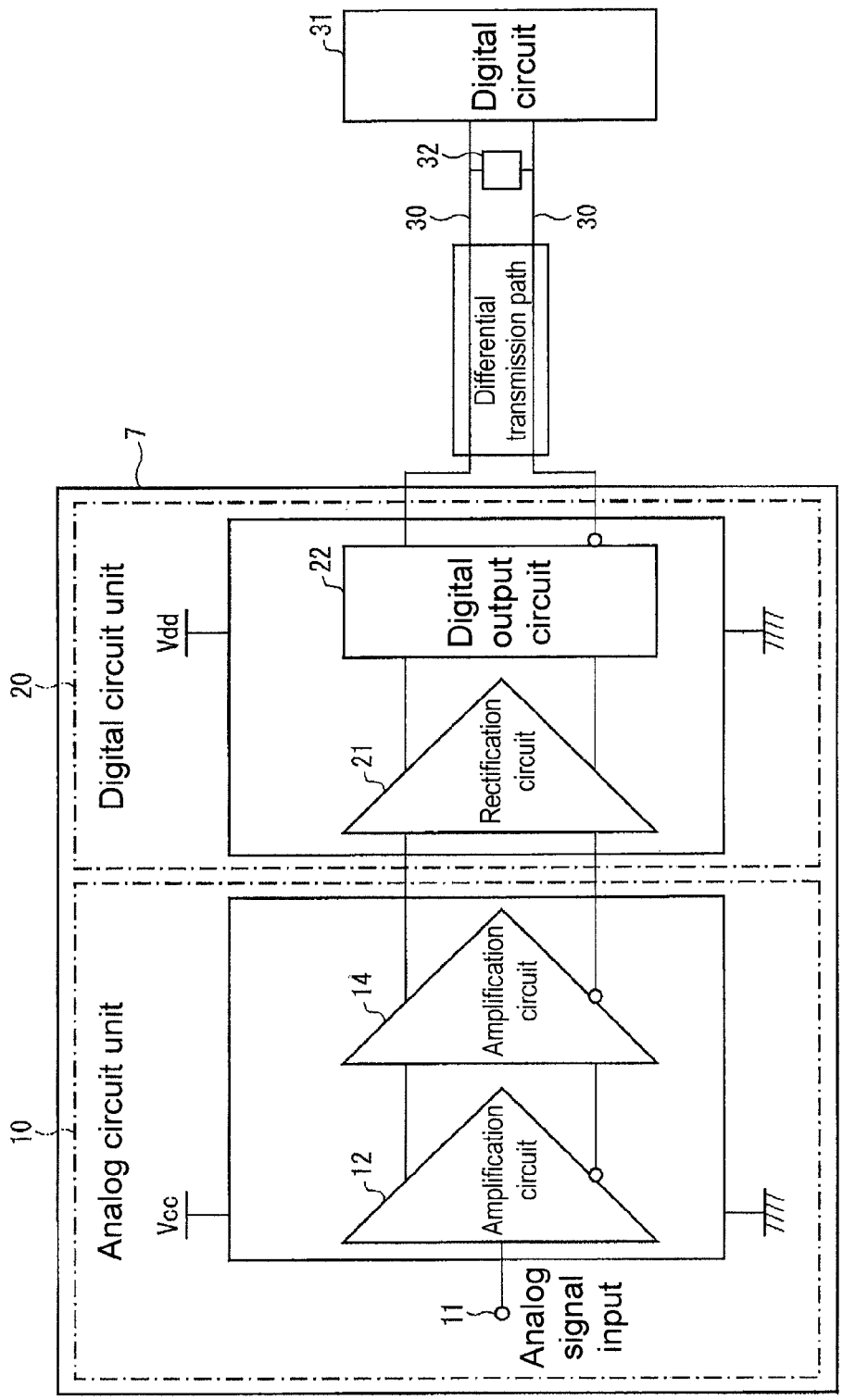
FIG. 4 is a circuit diagram showing a schematic configuration of an amplification unit of a light reception processing section in an optical transmission module according to another embodiment of the present invention.

Another embodiment of the present invention will be described based on FIG. 4 to FIG. 7. FIG. 4 is a circuit diagram showing a schematic configuration of the amplification unit 7 of the light reception processing section 3 in the optical transmission module according to the present embodiment. The amplification unit 7 shown in FIG. 4 differs from the amplification unit 7 shown in FIG. 1 in that an amplification circuit 14 functioning as the LPF is arranged instead of the LPF 13, and the other configurations are the same. The same reference numerals are denoted for the configurations having similar functions as the configurations described in the above embodiment, and the description thereof will be omitted.

According to the above configuration, the LPF does not need to be added to the main path because the amplification circuit 14 functions as the LPF. Therefore, the circuit scale is prevented from increasing to reduce the noise from the digital circuit unit 20.

The amplification circuit 12 may function as the LPF. Furthermore, one or a plurality of amplification circuits may be arranged between the amplification circuit 12 and the amplification circuit 14, and all of the amplification circuits may function as the LPF. In this case, the gain of each stage is set small and the high-frequency component can be cut off compared to the case of one stage, and hence the oscillation of the signal by the high-frequency noise from the digital circuit unit 20 is made difficult.

Figure 5:
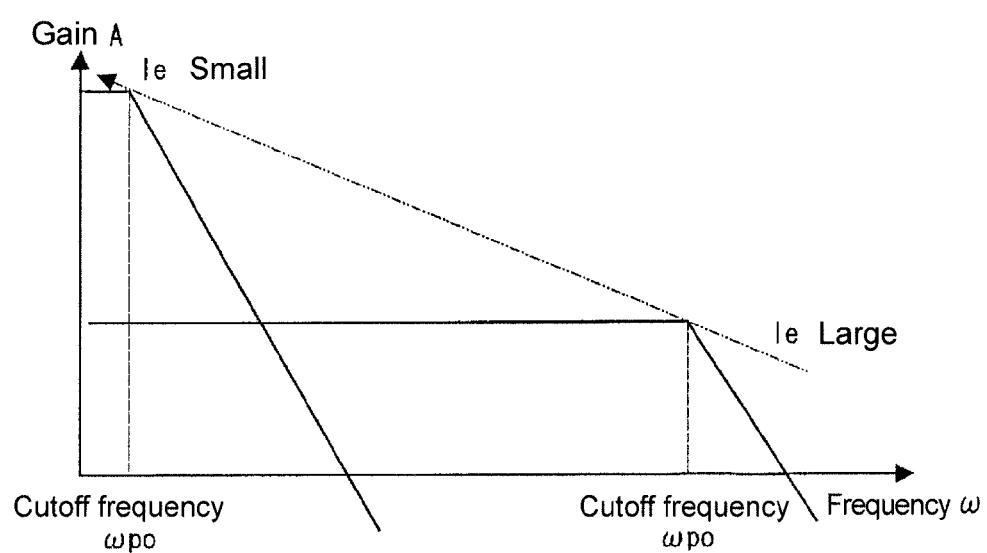
FIG. 5 is a graph showing a change in a cutoff frequency and a gain by an emitter current of a transistor.

The amplification circuit 14 functioning as the LPF can be realized by including specific circuit frequency characteristics (cutoff frequency). FIG. 5 shows gain-frequency characteristics of a transistor functioning as the amplification circuit 14, and shows the change in the cutoff frequency and the gain by an emitter current Ie or a collector current of the transistor. As shown in the figure, it can be recognized that the cutoff frequency increases when the emitter current Ie or the collector current becomes large. Therefore, it can be recognized that the range of the high-frequency noise to be reduced can be easily adjusted by adjusting the current value for driving the amplification circuit 14 such as the emitter current Ie or the collector current.

The emitter current Ie or the collector current of the transistor is desirably smaller than or equal to 1.0 mA to appropriately reduce the high-frequency noise from the digital circuit unit 20. The cutoff frequency is desirably smaller than or equal to 1.5 GHz.

More ideally, the current value for driving the amplification circuit 14 is desirably set to a value for adjusting the gain so that the cutoff frequency of the amplification circuit 14 comes between a basic frequency of the transmission frequency of the signal inputted to the amplification circuit 14 and a second-order harmonic frequency.

Figure 6:
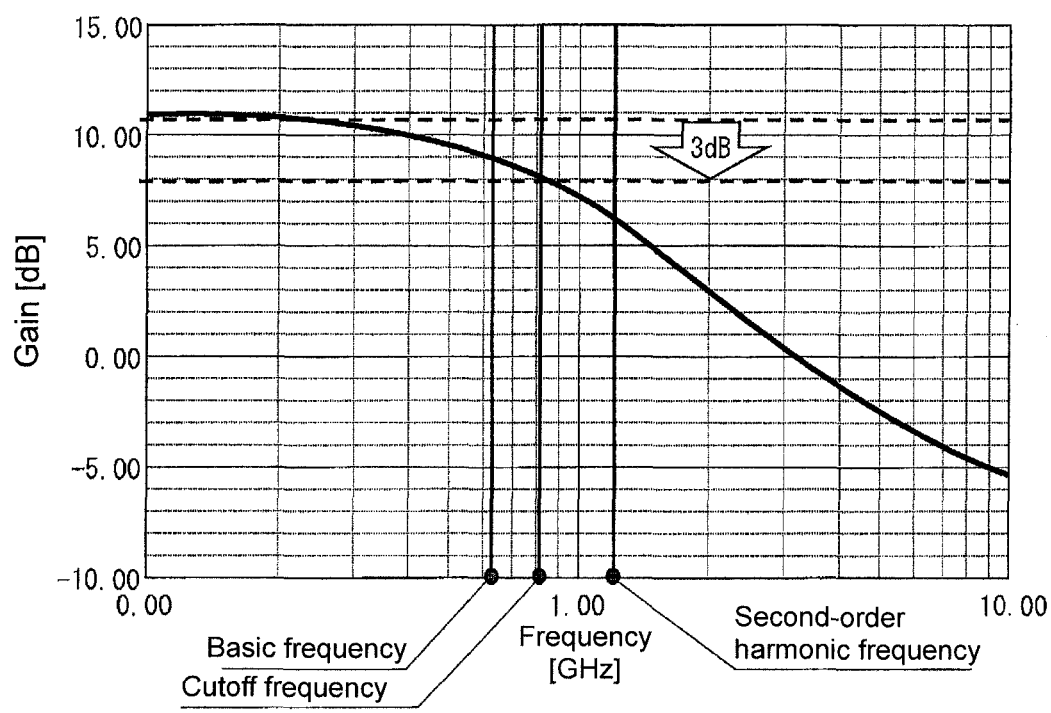
FIG. 6 is a graph showing gain-frequency characteristics in a specific example of an amplification circuit arranged in the amplification unit.
Figure 7:
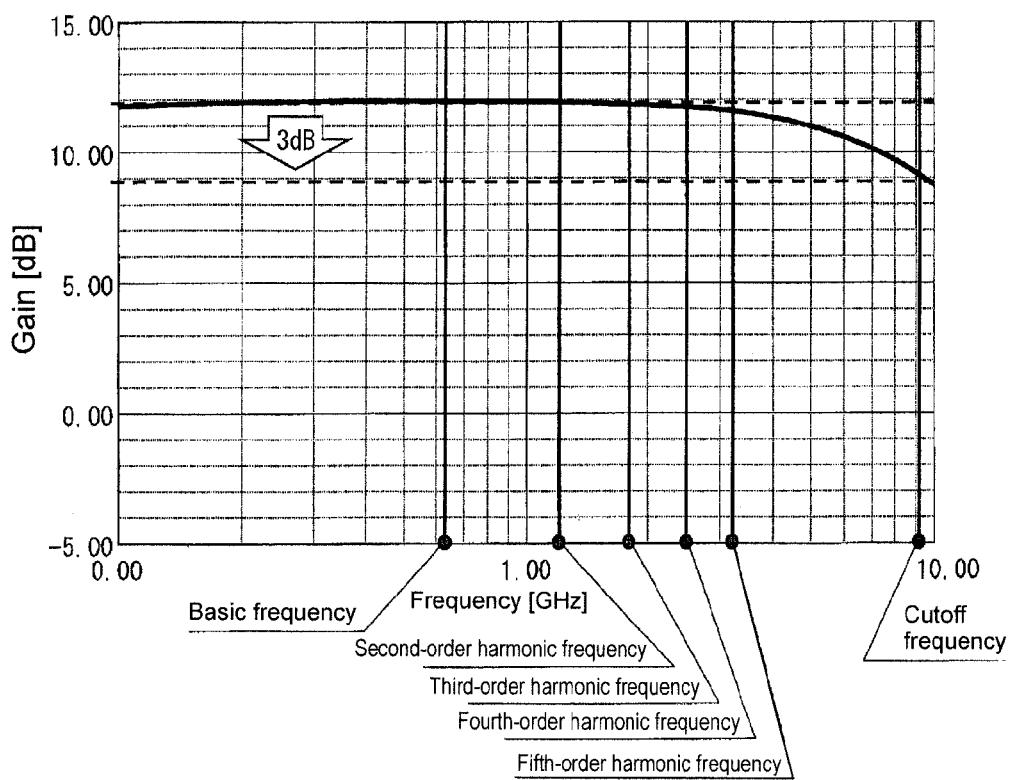
FIG. 7 is a comparative example of the specific example, and is a graph showing the gain-frequency characteristics in a conventional amplification circuit.

FIG. 6 shows the gain-frequency characteristics in a specific example of the amplification circuit 14 of the present embodiment. FIG. 7 is a comparative example of FIG. 6, and shows the gain-frequency characteristics in the conventional amplification circuit. FIG. 6 and FIG. 7 show an example of a case where the data transmission speed is 1.25 Gbps. In this case, the basic frequency is 625 MHz.

As shown in FIG. 7, the cutoff frequency in the conventional amplification circuit is set to greater than or equal to the frequency (3.125 GHz) of the five-order harmonic of the basic frequency. On the contrary, the cutoff frequency in the amplification circuit 14 of the present example is set between the basic frequency (625 MHz) and the second-order harmonic frequency (1.25 GHz) thereof, as shown in FIG. 6.

Comparing FIG. 6 and FIG. 7, it can be recognized that the amplification circuit 14 of the present example can greatly reduce the harmonic noise of the frequency higher than the transmission frequency of the inputted signal than the conventional amplification circuit. The output waveform from the amplification circuit 14 thus becomes a waveform close to the basic wave of the inputted signal because the harmonic component of the inputted signal is not amplified.

Third Embodiment

Figure 8:
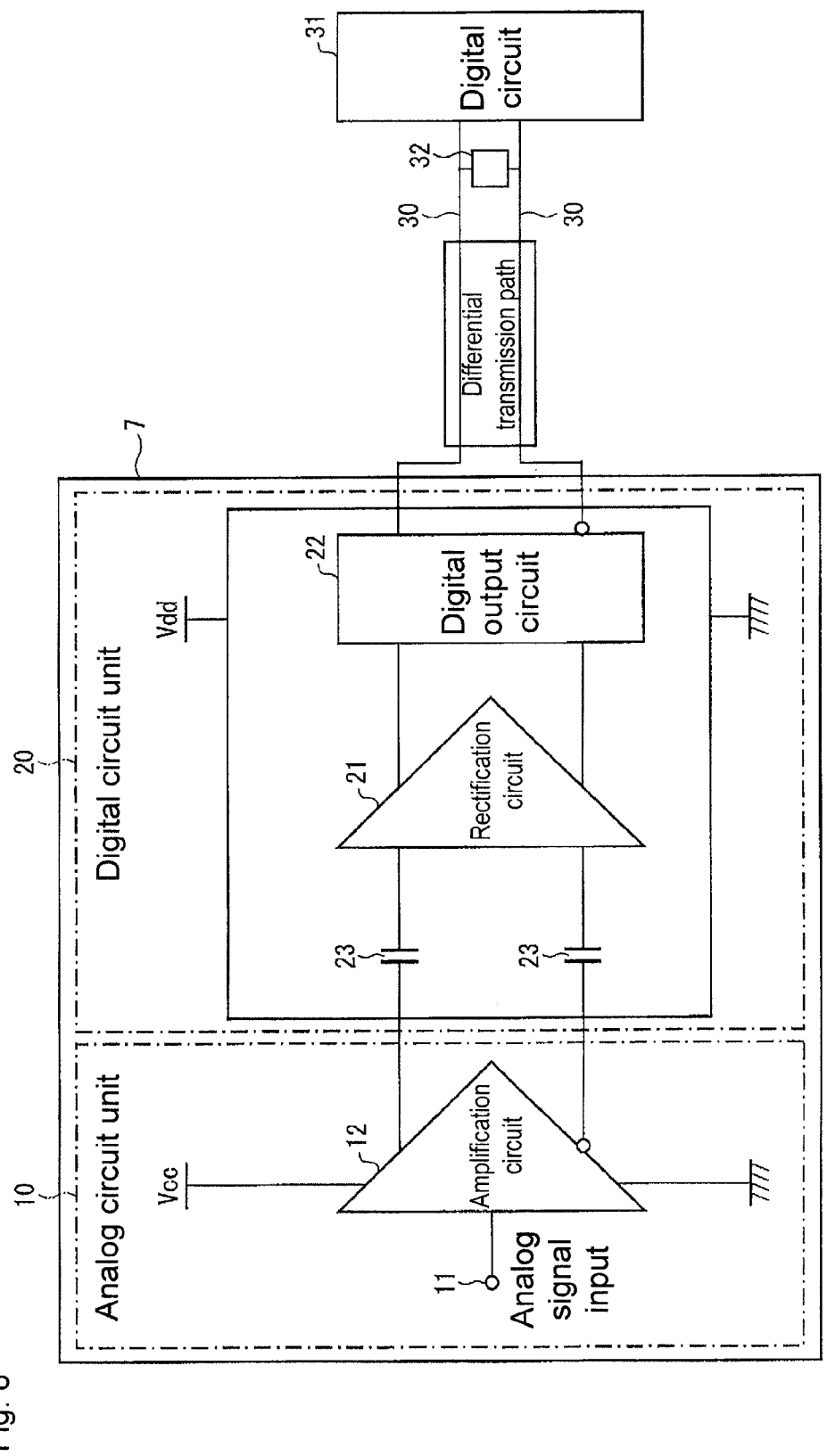
FIG. 8 is a circuit diagram showing a schematic configuration of an amplification unit in a light reception processing section in an optical transmission module according to still another embodiment of the present invention.

Still another embodiment of the present invention will now be described based on FIG. 8. FIG. 8 is a circuit diagram showing a schematic configuration of the amplification unit 7 in the light reception processing section 3 in the optical transmission module according to the present embodiment. The amplification unit 7 shown in FIG. 8 differs from the amplification unit 7 shown in FIG. 1 in that the LPF 13 is omitted because the amplification circuit 12 functions as the LPF and that capacitors 23, 23 are arranged on the main path between the amplification circuit 12 and the rectification circuit 21, and other configurations are the same. The same reference numerals are denoted for the configurations having the functions similar to the functions described in the above embodiment, and the description thereof will be omitted.

In the present embodiment, the amplification circuit 12 functions as the LPF, similar to the amplification circuit 14 shown in FIG. 4. The LPF thus does not need to be added to the main path. Therefore, the circuit scale is prevented from being increased to reduce the noise from the digital circuit unit 20.

The capacitors 23, 23 function as capacitive coupling, and output only the vibration component in the signal to the rectification circuit 21 when a differential analog signal amplified by the amplification circuit 12 is inputted.

As described above, the common mode voltage of the analog circuit unit 10 is higher than the common mode voltage of the digital circuit unit 20 due to the miniaturization of the digital circuit unit 20. Thus, when the signal generated in the analog circuit unit 10 is transmitted to the digital circuit unit 20, problems such as malfunction of the circuit may occur.

In the present embodiment, on the other hand, the common mode voltage is at ground level because the direct current (DC) components are removed by the capacitors 23, 23 before being inputted to the circuit of the digital circuit unit 20, and hence the occurrence of such problems can be prevented.

The capacitors 23, 23 are desirably arranged in the digital circuit unit 20. In this case, wiring from the capacitors 23, 23 to the circuit (rectification circuit 21 in the example of FIG. 8) of the digital circuit unit 20 can be shortened, and the possibility of the voltage fluctuation occurring in such wiring can be reduced.

Fourth Embodiment

Figure 9:
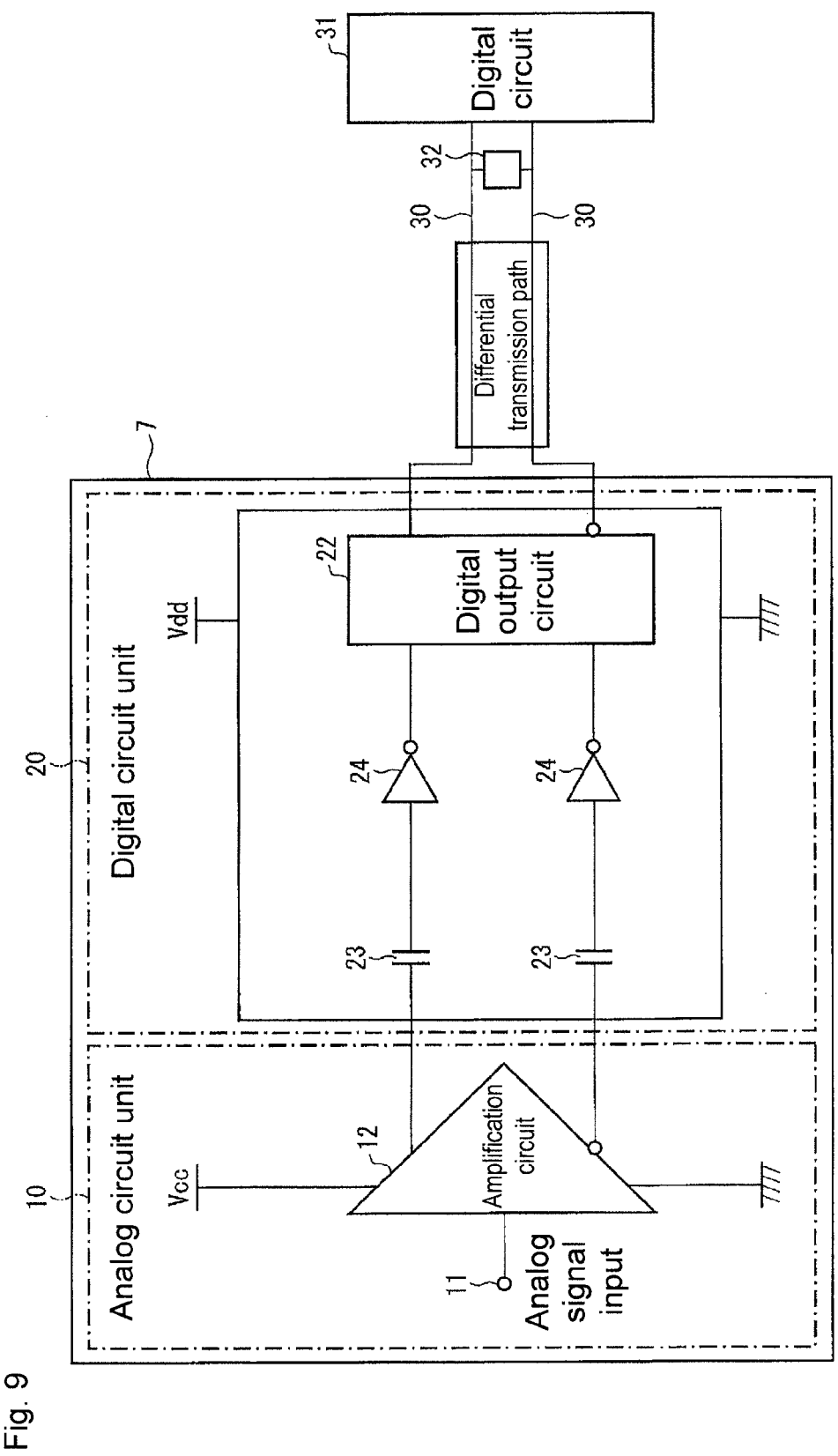
FIG. 9 is a circuit diagram showing a schematic configuration of an amplification unit in a light reception processing section in an optical transmission module according to yet another embodiment of the present invention.

Yet another embodiment of the present invention will now be described based on FIG. 9. FIG. 9 is a circuit diagram showing a schematic configuration of the amplification unit 7 in the light reception processing section 3 in the optical transmission module according to the present embodiment. The amplification unit 7 shown in FIG. 9 differs from the amplification unit 7 shown in FIG. 8 in that inverters 24, 24 are arranged as a specific configuration of the rectification circuit 21, and other configurations are the same. The same reference numerals are denoted for the configurations having the functions similar to the functions described in the above embodiment, and the description thereof will be omitted.

According to the above configuration, the inverters 24, 24 can suppress the power consumption low because the oscillation of the gain is small compared to the comparator having the similar waveform rectifying function. The inverters 24, 24 desirably have a configuration in which inverters of different threshold values are connected in plural stages to further enhance the noise characteristics.

In the above-described embodiment, the optical transmission module 1 has a configuration in which the light transmission processing section 2, the light reception processing section 3, and the optical waveguide 4 are integrally arranged, as shown in FIG. 2, but the optical transmission module 1 may have other configurations.

Figure 10:
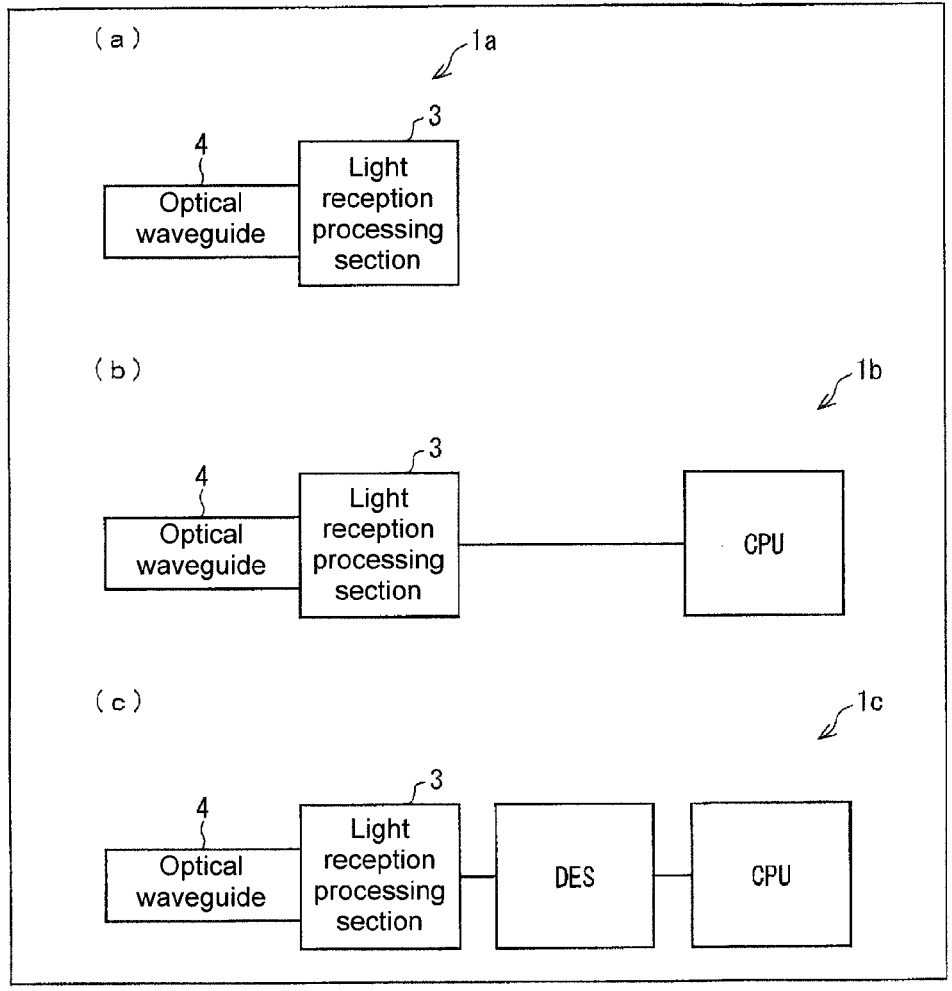
FIGS. 10(*a*) to 10(*c*) are block diagrams schematically showing other configuration examples of the optical transmission module.

FIGS. 10(*a*) to 10(*c*) show another configuration example of the optical transmission module. In the example of FIG. 10(*a*), an optical transmission module (communication module) 1*a* has a configuration in which the light reception processing section 3 and the optical waveguide 4 are integrally arranged. In the example of FIG. 10(*b*), an optical transmission module (communication module) 1*b* has a configuration in which a CPU as an example of an external digital circuit 31 is further added to the configuration of the optical transmission module 1*a* shown in FIG. 10(*a*). In the example of FIG. 10(*c*), an optical transmission module (communication module) 1*c* has a configuration in which a deserializer DES for converting an electric signal from a serial signal to a parallel signal is further added as an example of the external digital circuit 31 to the configuration of the optical transmission module 1*b* shown in FIG. 10(*b*). The optical transmission module 1*c* may also have a clock recovery function.

Figure 11:
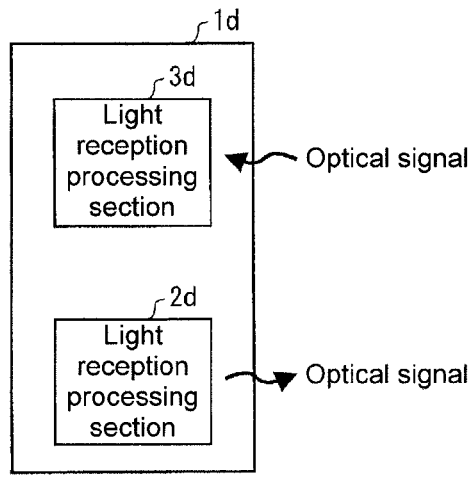
FIGS. 11(*a*) to 11(*c*) are block diagrams schematically showing other configuration examples of the optical transmission module.

FIG. 11 shows another configuration example of the optical transmission module. In the illustrated example, an optical transmission module (transmission/reception device) 1*d* has a configuration in which a light transmission processing section 2*d* for transmitting optical signals and a light reception processing section 3*d* for receiving optical signals are integrally arranged.

The optical transmission module shown in FIG. 1 to FIG. 11 can be applied to the following application examples.

As a first application example, use can be made at a hinge in a foldable electronic device such as a foldable portable telephone, a foldable PHS (Personal Handy-phone System), a foldable PDA (Personal Digital Assistant), and a foldable notebook personal computer.

Figure 12:
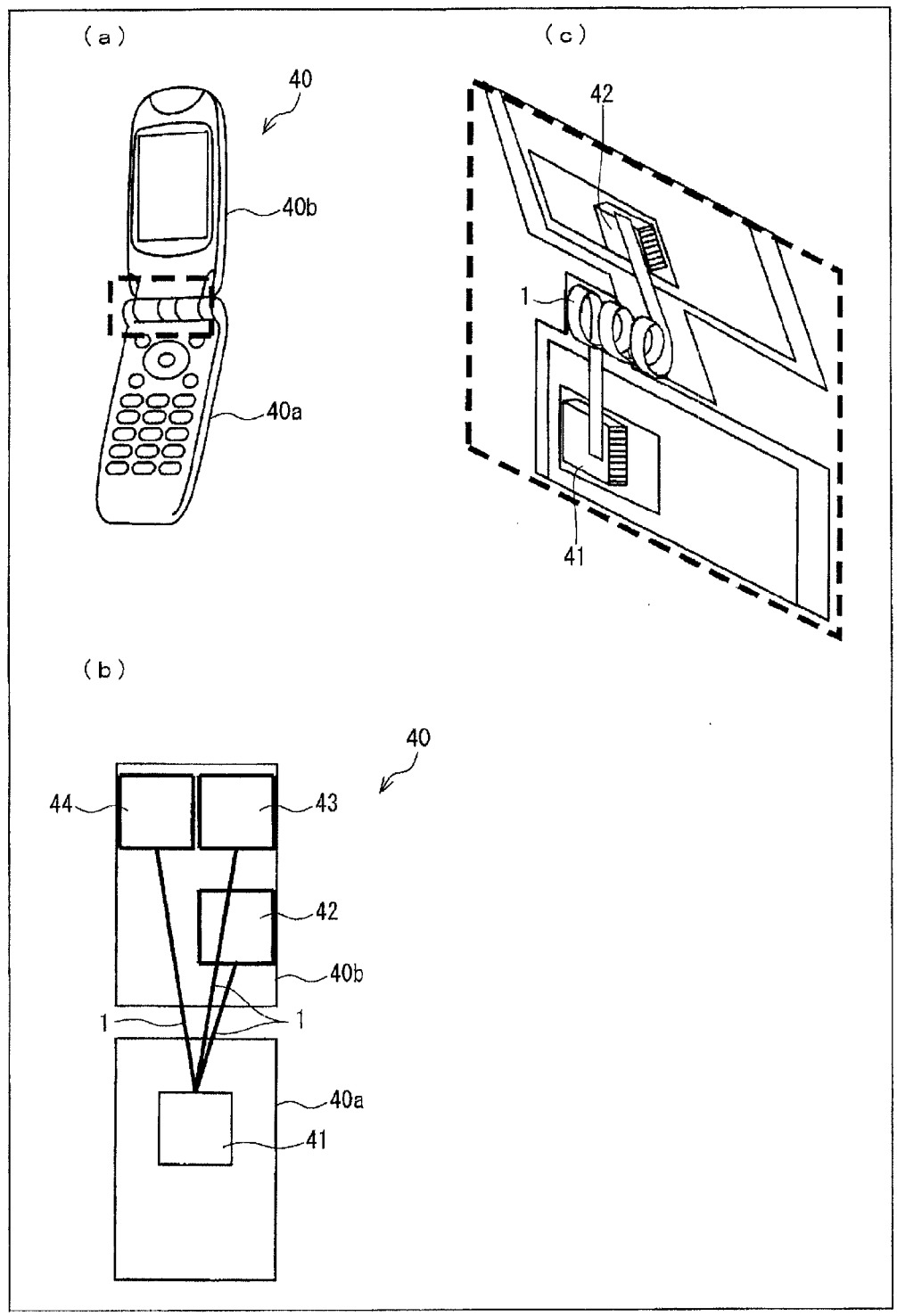
FIGS. 12(*a*) to 12(*c*) are views showing an example in which the optical transmission module is applied to a foldable portable telephone.

FIGS. 12(*a*) to 12(*c*) show an example in which the optical transmission module 1 is applied to the foldable portable telephone 40. In other words, FIG. 12(*a*) is a perspective view showing an outer appearance of the foldable portable telephone 40 incorporating the optical transmission module 1.

FIG. 12(*b*) is a block diagram of the portion applied with the optical transmission module 1 in the foldable portable telephone 40 shown in FIG. 12(*a*). As shown in the figure, a control unit 41 arranged on a main body 40*a* side in the foldable portable telephone 40, and an external memory 42, a camera (digital camera) 43, and a display unit (liquid crystal display) 44 arranged on a lid (drive unit) 40*b* side rotatably arranged at one end of the main body with the hinge as a shaft are respectively connected by the optical transmission module 1.

FIG. 12(*c*) is a perspective plan view of the hinge (portion surrounded with a broken line) in FIG. 12(*a*). As shown in the figure, the optical transmission module 1 connects the control unit arranged on the main body side, and the external memory 42, the camera 43, and the display unit 44 arranged on the lid side by being wrapped around a supporting rod at the hinge and bent.

The high speed and large capacity communication can be realized in a limited space by applying the optical transmission module 1 to the foldable electronic devices. Therefore, it is particularly suitable for devices that require high speed and large capacity data communication and that are demanded miniaturization such as the foldable liquid crystal display device.

As a second application example, the optical transmission module 1 can be applied to a device including the drive unit such as a printer head in a printing device (electronic device) and a reading unit in a hard disc recording and reproducing device.

Figure 13:
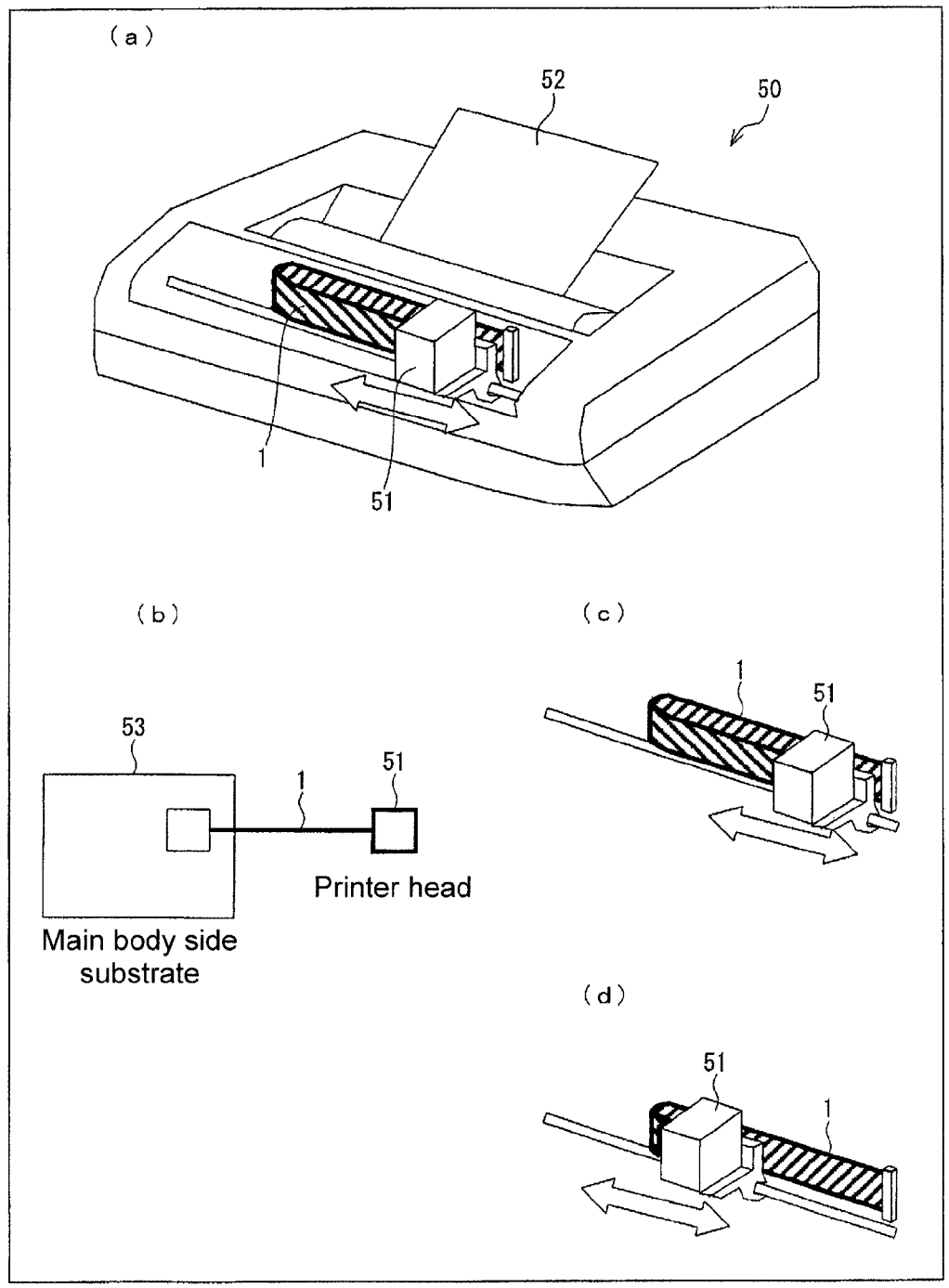
FIGS. 13(*a*) to 13(*d*) are views showing an example in which the optical transmission module is applied to a printing device.

FIGS. 13(*a*) to 13(*d*) show an example in which the optical waveguide 1 is applied to a printing device 50. FIG. 13(*a*) is a perspective view showing an outer appearance of the printing device 50. As shown in the figure, the printing device 50 includes a printer head 51 for performing printing on paper 52 while moving in a width direction of the paper 52, and one end of the optical transmission module 1 is connected to the printer head 51.

FIG. 13(*b*) is a block diagram of the portion applied with the optical transmission module 1 in the printing device 50. As shown in the figure, one end of the optical transmission module 1 is connected to the printer head 51, and the other end is connected to the main body side substrate in the printing device 50. The main body side substrate includes control means for controlling the operation of each unit of the printing device 50, and the like.

FIGS. 13(*c*) and 13(*d*) are perspective views showing a curved state of the optical transmission module 1 in a case where the printer head 51 is moved (driven) in the printing device 50. As shown in the figure, when applying the optical transmission module 1 to the drive unit such as the printer head 51, the curved state of the optical transmission module 1 changes by the drive of the printer head 51, and each position of the optical transmission module 1 is repeatedly curved.

Therefore, the optical transmission module 1 according to the present embodiment is suitable for such drive units. The high speed and large communication using the drive unit can be realized by applying the optical transmission module 1 to such drive units.

Figure 14:
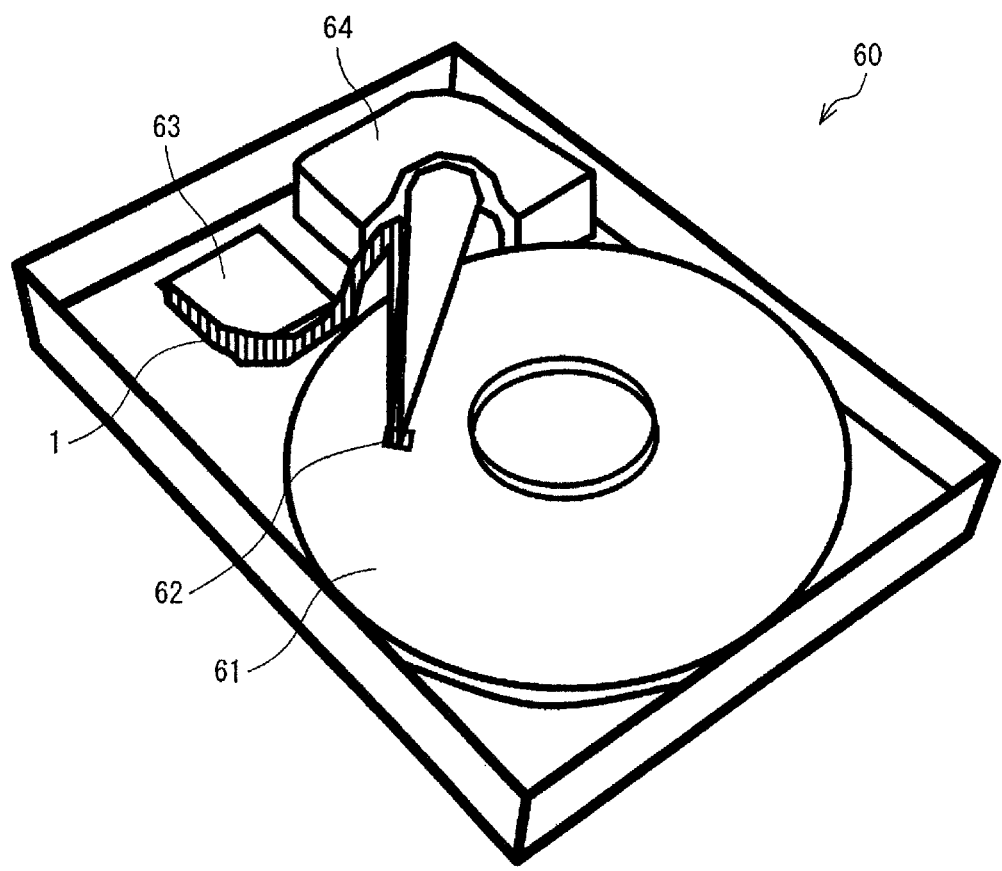
FIG. 14 is a view showing an example in which the optical transmission module is applied to a hard disc recording and reproducing device.

FIG. 14 shows an example in which the optical transmission module 1 is applied to a hard disc recording and reproducing device 60. As shown in the figure, the hard disc recording and reproducing device 60 includes a disc (hard disc) 61, a head (reading and writing head) 62, a substrate introducing unit 63, a drive unit (drive motor) 64, and the optical transmission module 1.

The drive unit 64 drives the head 62 along the radial direction of the disc 61. The head 62 reads the information recorded on the disc 61, and also writes the information on the disc 61. The head 62 is connected to the substrate introducing unit 63 by way of the optical transmission module 1, and propagates the information read from the disc 61 to the substrate introducing unit 63 as an optical signal or receives the optical signal of the information to write to the disc 61 propagated from the substrate introducing unit 63.

The high speed and large capacity communication can be realized by applying the optical transmission module 1 to the drive unit such as the head 62 in the hard disc recording and reproducing device 60.

The present invention is not limited to the above-described embodiments, and various modifications can be made within the scope defined by the claims, where the embodiments obtained by appropriately combining the technical means disclosed in the different embodiments are also encompassed in the technical scope of the present invention.

For instance, the description is made with the present invention applied to the optical transmission module 1 in the above-described embodiment, but application can be made to an arbitrary signal processing device for amplifying an analog signal and converting the same to a digital signal of a predetermined format.

Therefore, a signal processing device according to one or more embodiments of the present invention can reduce a high-frequency noise mixed in an analog signal propagated from a digital circuit unit to an analog circuit unit and can also suppress an increase in power consumption, and hence application can be made on an arbitrary device in which the analog circuit and the digital circuit are mounted on one chip.

The invention claimed is:

1. A signal processing device for amplifying an inputted analog signal, and converting the amplified signal to a digital signal for output comprising:
    an analog circuit unit for processing the analog signal arranged on a substrate; and
    a digital circuit unit for processing the digital signal arranged on a substrate,
    wherein the analog circuit unit performs amplification and cuts off a high frequency component with respect to the inputted analog signal,
    wherein the digital circuit unit performs conversion to a digital signal of a predetermined format and waveform rectification with respect to the signal which is subjected to amplification and whose high frequency component is cut off by the analog circuit unit for output,
    wherein the digital circuit unit comprises a conversion circuit for rectifying the waveform for output by converting the signal which is subjected to amplification and whose high frequency component is cut off by the analog circuit unit to the digital signal, and
    wherein the analog circuit unit differentially outputs a signal which is subjected to amplification and whose high frequency component is cut off.

2. The signal processing device according to claim 1, wherein the analog circuit unit further comprises:
    an amplification circuit for amplifying the inputted analog signal; and
    a low pass filter for cutting off the high frequency component of the analog signal amplified by the amplification circuit.

3. The signal processing device according to claim 1, wherein the analog circuit unit further comprises:
    an amplification circuit for amplifying the inputted analog signal, wherein the amplification circuit comprises a gain adjusted to cut off the high frequency component.

4. The signal processing device according to claim 3, wherein the analog circuit unit includes the amplification circuit in a plurality of stages.

5. The signal processing device according to claim 1, wherein the analog circuit unit and the digital circuit unit are capacitively coupled.

6. A reception device comprising:
    a receiving unit for receiving a signal from outside; and
    a reception processing unit for processing the signal received by the receiving unit,
    wherein the reception processing unit is the signal processing device according to claim 1.

7. A transmission/reception device comprising:
    a transmission device for transmitting a signal to outside; and
    a reception device for receiving and processing a signal from outside,
    wherein the reception device is the reception device according to claim 6.

8. A communication module comprising the reception device according to claim 6, and a digital device for performing processes on the digital signal outputted by the reception device.

9. An electronic device comprising the communication module according to claim 8.

10. A communication module comprising:
    a reception device according to claim 6;
    a transmission device for transmitting an analog signal; and
    a transmission medium for transmitting the analog signal from the transmission device to the reception device.

11. An electronic device comprising the communication module according to claim 10.

12. A signal processing device for amplifying an inputted analog signal, and converting the amplified signal to a digital signal for output comprising:
    an analog circuit unit for processing the analog signal arranged on a substrate; and
    a digital circuit unit for processing the digital signal arranged on a substrate,
    wherein the analog circuit unit performs amplification and cuts off a high frequency component with respect to the inputted analog signal,
    wherein the digital circuit unit performs conversion to a digital signal of a predetermined format and waveform rectification with respect to the signal which is subjected to amplification and whose high frequency component is cut off by the analog circuit unit for output,
    wherein the analog circuit unit further comprises an amplification circuit for amplifying the inputted analog signal,
    wherein the amplification circuit comprises a gain adjusted to cut off the high frequency component, and
    wherein the gain is adjusted with a current value for driving the amplification circuit.

13. The signal processing device according to claim 12, wherein the current value is smaller than or equal to 1 mA.

14. The signal processing device according to claim 12, wherein the current value is a value for adjusting the gain so that a cutoff frequency for cutting off the high frequency component is between a basic frequency of a transmission frequency of the inputted analog signal and a second-order harmonic frequency.

15. A signal processing device for amplifying an inputted analog signal, and converting the amplified signal to a digital signal for output comprising:
    an analog circuit unit for processing the analog signal arranged on a substrate; and
    a digital circuit unit for processing the digital signal arranged on a substrate,
    wherein the analog circuit unit performs amplification and cuts off a high frequency component with respect to the inputted analog signal,
    wherein the digital circuit unit performs conversion to a digital signal of a predetermined format and waveform rectification with respect to the signal which is subjected to amplification and whose high frequency component is cut off by the analog circuit unit for output, and
    wherein the digital circuit unit further comprises:
    a waveform rectification circuit for rectifying a waveform of the signal which is subjected to amplification and whose high frequency component is cut off by the analog circuit unit, wherein the waveform rectification circuit is an inverter; and
    a conversion circuit for converting the signal which waveform is rectified by the waveform rectification circuit to the digital signal for output.

16. The signal processing device according to claim 15, wherein the digital circuit unit further comprises:
   a conversion circuit for rectifying the waveform for output by converting the signal which is subjected to amplification and whose high frequency component is cut off by the analog circuit unit to the digital signal.

17. A signal processing method of a signal processing device for amplifying an inputted analog signal, and converting the amplified signal to a digital signal for output, the signal processing device having an analog circuit unit for processing the analog signal and a digital circuit unit for processing the digital signal arranged on a substrate, the method comprising the steps of:
   performing amplification and cutting off a high frequency component with respect to the inputted analog signal in the analog circuit unit;
   performing conversion to a digital signal of a predetermined format and waveform rectification with respect to a signal which is subjected to amplification and whose high frequency component is cut off in the digital circuit unit for output; and
   rectifying the waveform for output by converting the signal which is subjected to amplification and whose high frequency component is cut off by the analog circuit unit to the digital signal, and
   wherein the analog circuit unit differentially outputs a signal which is subjected to amplification and whose high frequency component is cut off.

* * * * *